(12) United States Patent
Hsu et al.

(10) Patent No.: US 11,935,800 B2
(45) Date of Patent: Mar. 19, 2024

(54) COMPOUND METAL LID FOR SEMICONDUCTOR CHIP PACKAGE

(71) Applicant: HOJET TECHNOLOGY CO., LTD., New Taipei (TW)

(72) Inventors: Ying-Lin Hsu, New Taipei (TW); Juei-An Lo, Taoyuan (TW)

(73) Assignee: HOJET TECHNOLOGY CO., LTD., New Taipei (TW)

( * ) Notice: Subject to any disclaimer, the term of this patent is extended or adjusted under 35 U.S.C. 154(b) by 138 days.

(21) Appl. No.: 17/585,556

(22) Filed: Jan. 27, 2022

(65) Prior Publication Data

US 2023/0068670 A1  Mar. 2, 2023

(30) Foreign Application Priority Data

Sep. 1, 2021 (TW) .................................. 11013237.0

(51) Int. Cl.
*H01L 23/06* (2006.01)
(52) U.S. Cl.
CPC .................................... *H01L 23/06* (2013.01)
(58) Field of Classification Search
CPC ...................................................... H01L 23/06
See application file for complete search history.

(56) References Cited

U.S. PATENT DOCUMENTS

| 6,169,665 B1* | 1/2001 | Lepping | ............... | H05K 9/0032 |
| | | | | 361/801 |
| 10,299,416 B2* | 5/2019 | Vehkapera | ........... | H05K 9/0015 |

\* cited by examiner

Primary Examiner — Peniel M Gumedzoe
(74) Attorney, Agent, or Firm — Li & Cai Intellectual Property Office

(57) ABSTRACT

A compound metal lid for semiconductor chip package is provided. The compound metal lid includes a first cover and a second cover. The first cover has a first frame body, a plurality of riveting holes, and an upper opening. The riveting holes penetrate through the first frame body and are distributed symmetrically on the first frame body. The upper opening is formed at an inner part of the first frame body, and the riveting holes surround the upper opening. The second cover has a second frame body, a plurality of riveting protrusions, and a lower opening. The riveting protrusions are formed on the upper surface of the second frame body. The lower opening penetrates through the second frame body. The first cover is disposed on an upper surface of the second cover, and the riveting protrusions are correspondingly riveted in the riveting holes.

9 Claims, 5 Drawing Sheets

COMPOUND METAL LID FOR SEMICONDUCTOR CHIP PACKAGE

CROSS-REFERENCE TO RELATED PATENT APPLICATION

This application claims the benefit of priority to Taiwan Patent Application No. 110132370, filed on Sep. 1, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a compound metal lid for a semiconductor chip package, and more particularly to a compound metal lid that is a combination of two metal plates of different or the same materials, and is configured to be disposed on a substrate of a semiconductor chip package.

BACKGROUND OF THE DISCLOSURE

When production of a wafer is finished, the wafer usually is sliced up into many pieces of dies, such as processor cores. Next, the die is mounted onto a semiconductor substrate. A substrate can be regarded as a smaller and more precise printed circuit board. The die usually is mounted onto the substrate using a flip-chip package technology. To prevent a warpage from occurring on the substrate in subsequent processes and to enhance the heat-dissipation function of the die, a top cover is usually disposed on the substrate, and the top cover is also called integrated heat spreader (IHS).

However, as the size of the chip becomes bigger, the size of the substrate also becomes larger. A conventional single-piece top cover is difficult to prevent the warpage problem of the substrate. On the other hand, certain top covers are in a shape of a square frame, so that a top surface of the die is directly exposed.

Therefore, it has become an issue to be addressed in the art for increasing the structural strength of a compound metal lid for a semiconductor chip package through an improved structural design, so as to prevent warpage of the substrate.

SUMMARY OF THE DISCLOSURE

In response to the above-referenced technical inadequacies, the present disclosure provides a compound metal lid for a semiconductor chip package, which can be applied to large-sized semiconductor chip and substrate thereof, so as to increase the integral structural strength of the substrate and prevent warpage of the substrate.

In one aspect, the present disclosure provides a compound metal lid for a semiconductor chip package, which includes a first cover and a second cover. The first cover has a first frame body, a plurality of riveting holes, and an upper opening. The plurality of riveting holes penetrate through the first frame body and are symmetrically distributed on the first frame body. The upper opening is formed at an inner part of the first frame body, and the riveting holes surround the upper opening. The second cover has a second frame body, a plurality of riveting protrusions, and a lower opening. The plurality of riveting protrusions are distributed on an upper surface of the second frame body. The lower opening penetrates through an inner part of the second frame body. The first cover is disposed on an upper surface of the second cover. The riveting protrusions are correspondingly riveted in the riveting holes.

Therefore, in the compound metal lid for a semiconductor chip package provided by the present disclosure, by virtue of "the first cover is disposed on the upper surface of the second cover" and "the riveting protrusions are correspondingly riveted in . . . the riveting holes," the compound metal lid can be applied to a large-sized semiconductor chip and the substrate of the large-sized semiconductor chip, so as to increase the total structural strength of the substrate, prevent the warpage issue from occurring on the substrate, and enhance the heat-dissipation function of the semiconductor chip.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
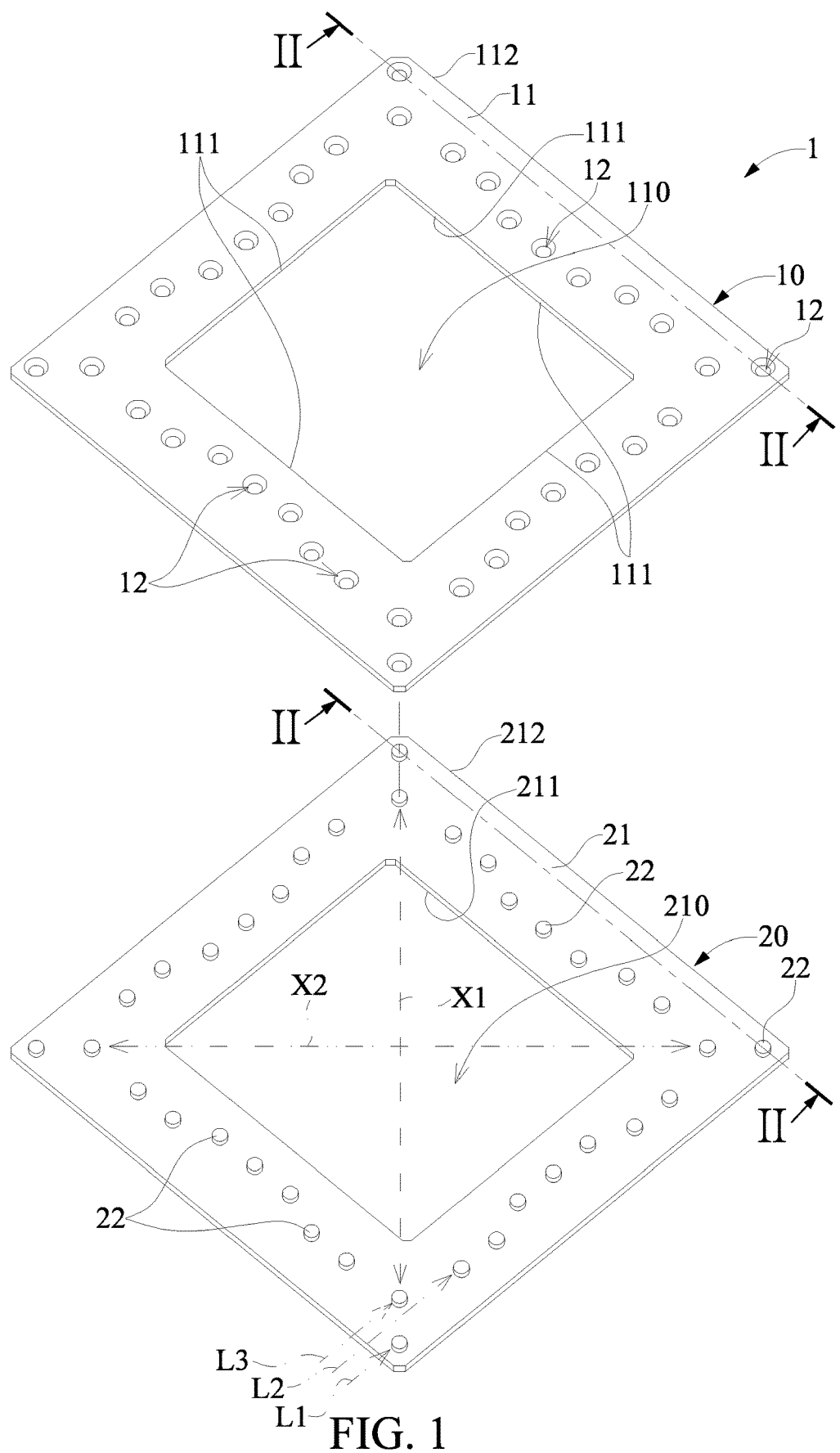
FIG. 1 is a perspective exploded view of a compound metal lid for a semiconductor chip package according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1, a first embodiment of the present disclosure provides a compound metal lid 1 for a semiconductor chip package, which includes a first cover 10 and a second cover 20.

The first cover 10 has a first frame body 11, a plurality of riveting holes 12, and an upper opening 110. The riveting holes 12 penetrate through the first frame body 11 and are symmetrically distributed on the first frame body 11. The upper opening 110 is formed at an inner part of the first frame body 11 and is located at an inner side of the riveting holes 12. In other words, the riveting holes 12 surround the upper opening 110.

The second cover 20 has a second frame body 21, a plurality of riveting protrusions 22, and a lower opening 210. The riveting protrusions 22 are distributed on an upper surface of the second frame body 21. The lower opening 210 is formed through an inner part of the second frame body 21. The first cover 10 is disposed on a top surface of the second cover 20. The riveting protrusions 22 are correspondingly riveted in the riveting holes 12.

In this embodiment, the material of the first cover 10 is preferably different from the material of the second cover 20. For example, the first cover 10 is made of copper alloy or ceramic, and the second cover 20 is made of stainless steel. The stainless steel can increase the total structural strength of the compound metal lid 1, and the copper alloy can increase the heat-dissipation and heat-conduction effects. However, the present disclosure is not limited thereto, and the material of the first cover 10 can be the same as that of the second cover 20.

The quantity of the riveting holes 12 is equal to that of the riveting protrusions 22. Preferably, the positions of the riveting holes 12 are symmetrically distributed at two sides of any one of diagonal lines of the first frame body 11. In other words, taking the second cover 20 as an example, along a diagonal line X1 in FIG. 1, the position and quantity of the riveting protrusions 22 at two sides of the diagonal line X1 are symmetric. In addition, along another diagonal line X2 in FIG. 1, the positions and numbers of the riveting protrusions 22 at two sides of the diagonal line X2 are also symmetric. From another viewing angle, the positions of the riveting holes 12 are symmetrically distributed at two sides of a central normal line of any side edge of the first frame body 11. Therefore, after assembly, the stress of the compound metal lid 1 is distributed symmetrically.

In this embodiment, the first frame body 11 has four inner edges 111, and four outer edges 112. Each of the inner edges 111 has an extension part 113 that protrudes toward the center of the first frame body 11. The extension parts 113 of this embodiment are rectangle-shaped, and an inner edge of each of the extension parts 113 is aligned to a corresponding inner edge of the second frame body 21. Preferably, the length of the inner edge of each of the extension parts 113 is larger than one-half of the length of the corresponding inner edge of the second frame body 21 by ratio. The four inner corners of the first frame body 11 form a notch 114, respectively. Such structure could be beneficial in increasing the overall structural strength of the compound metal lid 1, and increasing the flatness, thereby avoiding warpage and deformation. However, the present disclosure is not limited thereto, and the quantity of the extension part can be at least one.

The second frame body 21 has four side frames that have identical width. The second frame body 21 has four inner edges 211 and four outer edges 212. The outer edges 112 of the first cover 10 are respectively aligned to the outer edges 212 of the second cover 20. In this embodiment, the width of any one of the side frames is equal to a distance between the inner edge of one of the extension parts 113 of the first cover 10 and a corresponding outer edge of the first frame body 11. The riveting protrusions 22 on each side frame of the second frame body 21 are distributed along at least two straight lines parallel to the side frame. For example, referring to the side frame at the bottom right of the second frame body 21 in FIG. 1, the riveting protrusions 22 are respectively distributed along three imaginary lines that are a first line L1, a second line L2, and a third line L3. The three imaginary lines (L1, L2, L3) are parallel to each other.

Figure 2:
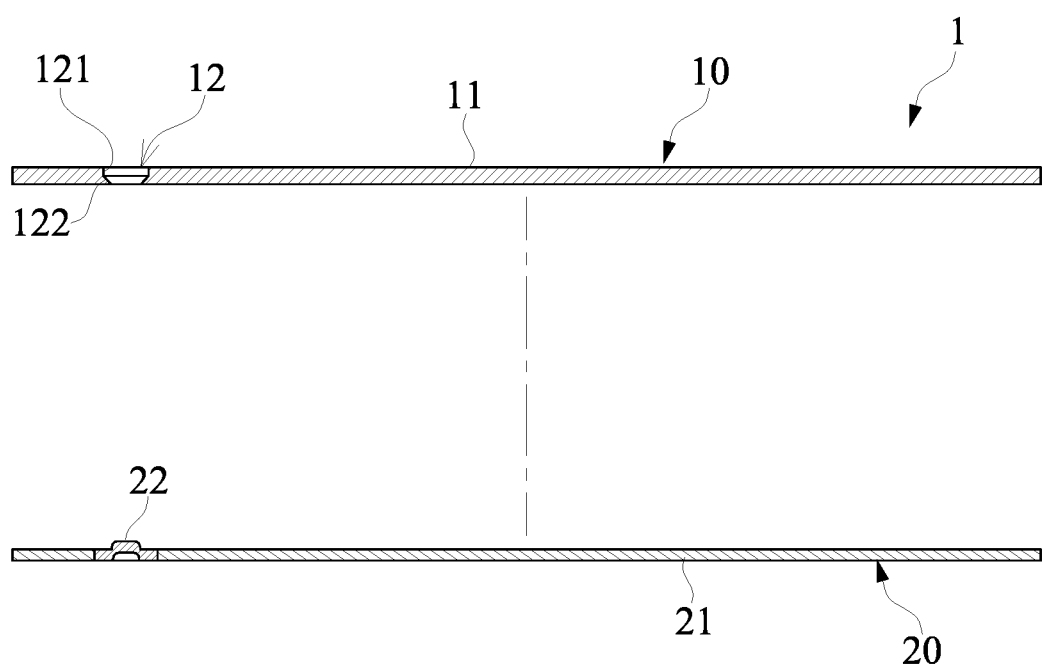
FIG. 2 is a cross-sectional exploded view of the compound metal lid according to the first embodiment of the present disclosure.
Figure 3:
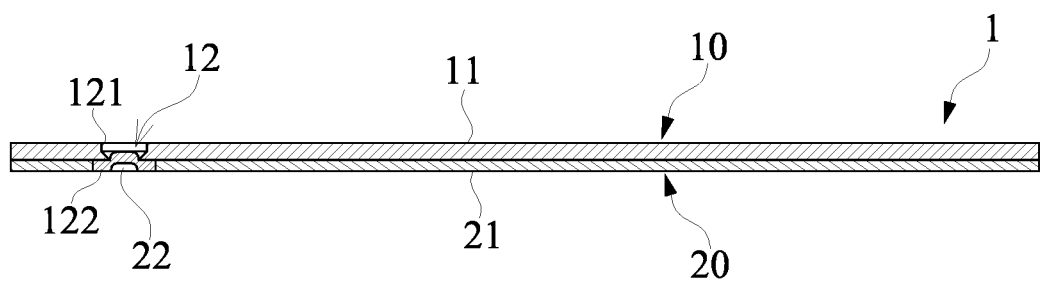
FIG. 3 is a cross-sectional view of the compound metal lid before riveting according to the first embodiment of the present disclosure.
Figure 4:
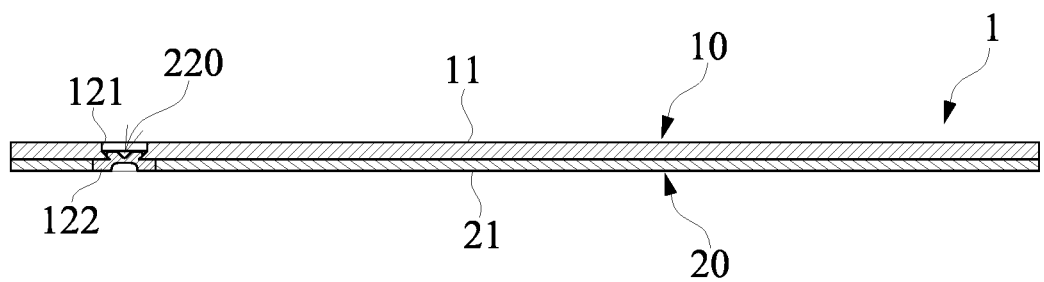
FIG. 4 is a cross-sectional view of the compound metal lid after riveting according to the first embodiment of the present disclosure.

Reference is made to FIG. 2 to FIG. 4. Each of the riveting holes 12 has an upper half-hole 121 and a lower half-hole 122 that is spatially connected to the upper half-hole 121. The upper half-hole 121 is shaped as a hollow cylinder and has a diameter identical throughout the upper half-hole 121. The lower half-hole 122 gradually tapers downward from the upper half-hole 121 and is substantially in a cone shape. Each of the riveting protrusions 22 is shaped as a cylinder and has a diameter identical throughout the riveting protrusion 22. The diameter of the riveting protrusion 22 is smaller than or equal to a minimum diameter of the lower half-hole 122. As shown in FIG. 3, after the first cover 10 and the second cover 20 are stacked with each other, before a riveting process, a height of the riveting protrusion 22 is substantially equal to that of the lower half-hole 122. The riveting protrusion 22 does not rise beyond the top surface of the first frame body 11.

As shown in FIG. 4, regarding the riveting process, a top center of the riveting protrusion 22 is hammered by using a pointed tip tool, and the riveting protrusion 22 concaves downward from a top center and extends outward and substantially forms an indentation 220. The outer edge of the riveting protrusion 22 extends and abuts against a periphery of the lower half-hole 122. Therefore, the riveting protrusion 22 is riveted in the riveting hole 12.

Second Embodiment

Figure 5:
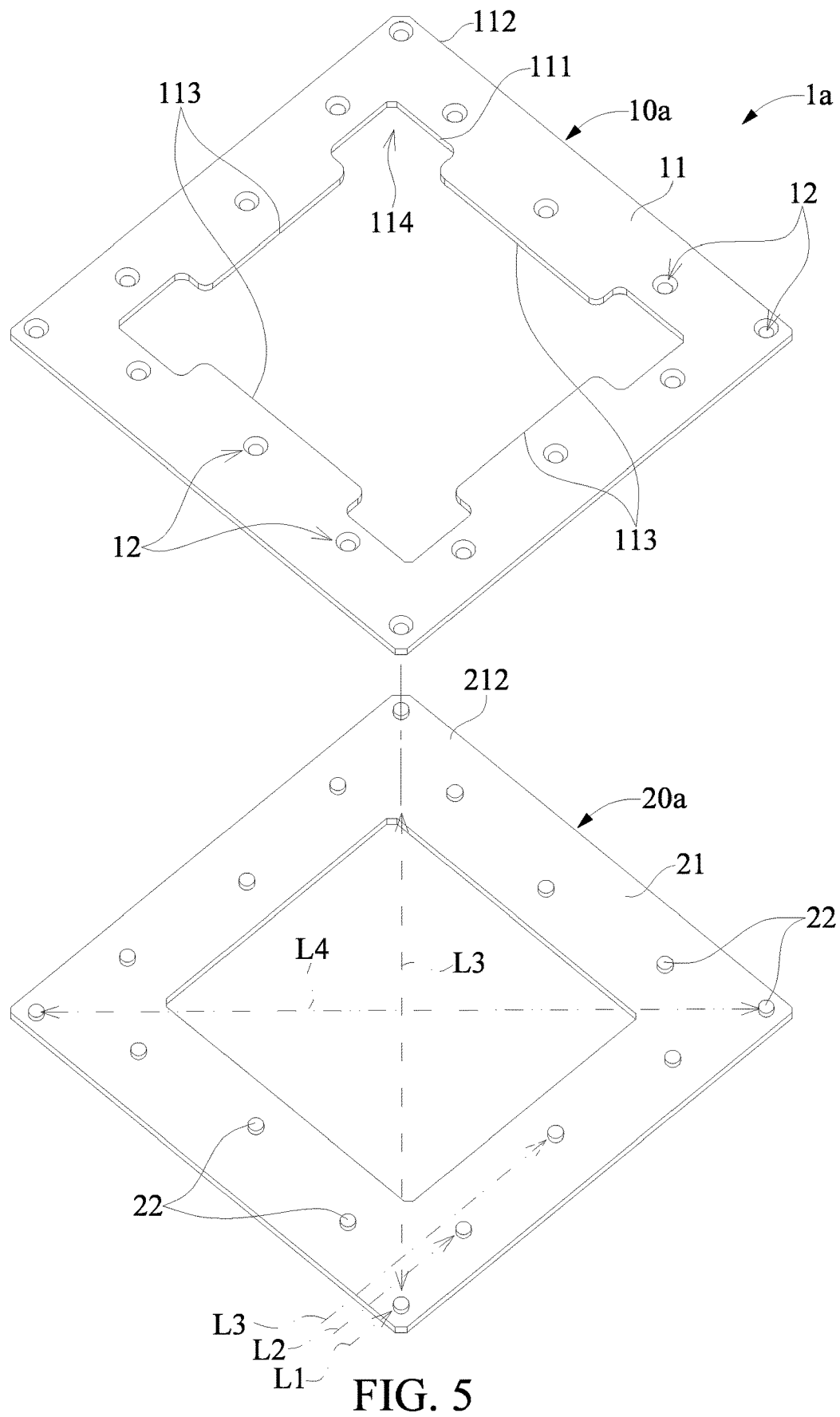
FIG. 5 is a perspective exploded view of the compound metal lid before riveting according to a second embodiment of the present disclosure.

Reference is made to FIG. 5, which is an exploded view of the compound metal lid according to a second embodiment of the present disclosure. Similarly, in this embodiment, the compound metal lid 1a has a first cover 10a and a second cover 20a, which are substantially in a similar shape as in the above embodiment. The main difference is that the quantities of the riveting holes 12 and the riveting protrusions 22 are less than those of the above embodiment.

Figure 6:
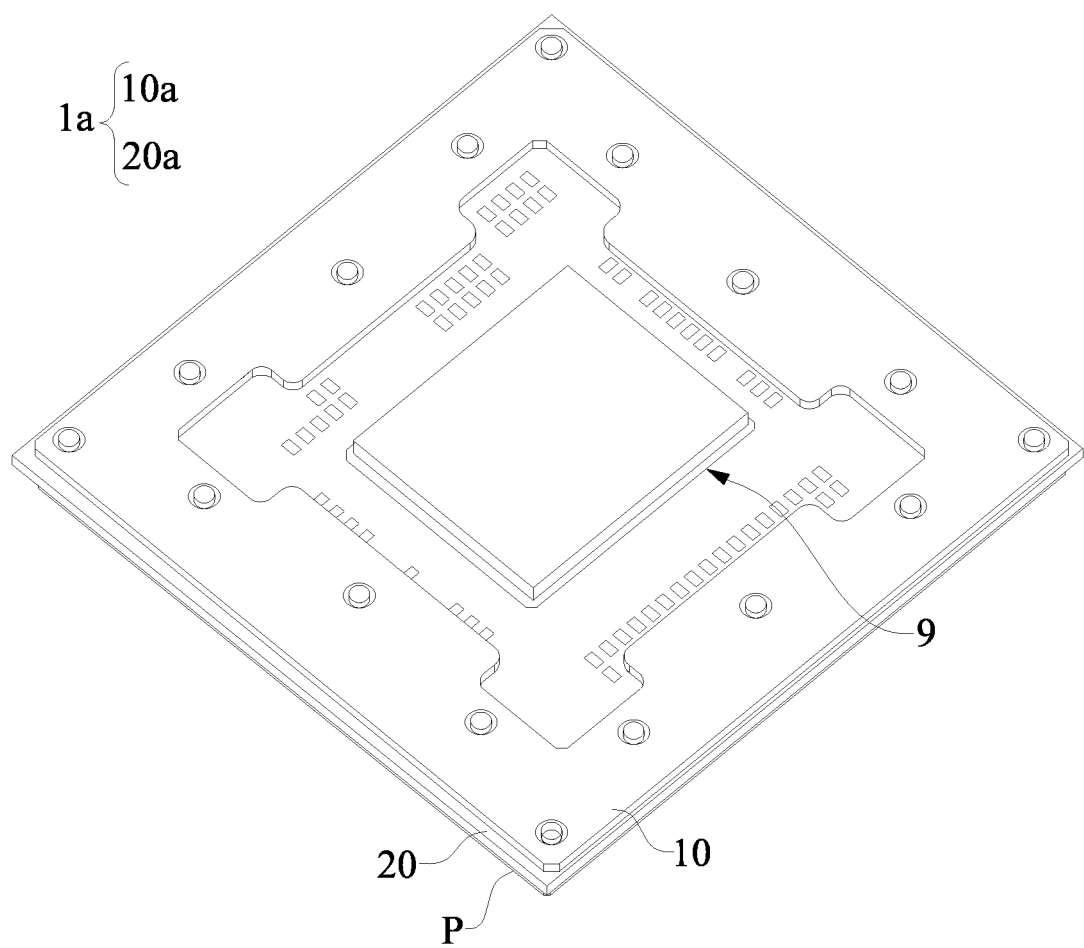
FIG. 6 is a perspective view of the compound metal lid assembled to a semiconductor chip package structure in the present disclosure.

Referring to FIG. 6, FIG. 6 is a perspective view showing the compound metal lid applied to a semiconductor chip package. The compound metal lid 1a is attached to a substrate P, the substrate P has a semiconductor chip 9 disposed thereon, and the semiconductor chip 9 usually is a central processing unit. The compound metal lid 1 surrounds the semiconductor chip 9.

Beneficial Effects of the Embodiments

In conclusion, the present disclosure has at least one beneficial effect that, by disposing the first cover on the top surface of the second cover, and utilizing the riveting protrusions to rivet in the riveting holes correspondingly, the compound metal lid for the semiconductor chip package is capable of fitting to a large-sized semiconductor chip and the substrate of the large-sized semiconductor chip, so as to increase the total structural strength of the substrate, prevent the warpage issue from occurring on the substrate, and enhance the heat-dissipation function of the semiconductor chip.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A compound metal lid for a semiconductor chip package, comprising:
    a first cover including a first frame body, a plurality of riveting holes, and an upper opening, wherein the riveting holes penetrate through the first frame body and are symmetrically distributed on the first frame body, the upper opening is formed at an inner part of the first frame body, and the riveting holes surround the upper opening; and
    a second cover including a second frame body, a plurality of riveting protrusions, and a lower opening, wherein the plurality of the riveting protrusions are distributed on an upper surface of the second frame body, and the lower opening penetrates through an inner part of the second frame body;
    wherein the first frame body of the first cover is disposed on the upper surface of the second frame body, and the plurality of the riveting protrusions are correspondingly riveted in the plurality of the riveting holes;
    wherein each of the riveting holes has an upper half-hole and a lower half-hole spatially connected to the upper half-hole, the upper half-hole has a diameter identical throughout the upper half-hole, the lower half-hole tapers downward from the upper half-hole, each of the riveting protrusions is shaped as a cylinder and has a diameter identical throughout the riveting protrusion, and a diameter of each of the riveting protrusions is smaller than or equal to a minimum diameter of any of the lower half-holes.

2. The compound metal lid according to claim 1, wherein a material of the first cover is different from a material of the second cover.

3. The compound metal lid according to claim 2, wherein the first cover is made of copper alloy or ceramic, and the second cover is made of stainless steel.

4. The compound metal lid according to claim 1, wherein a quantity of the riveting holes is equal to a quantity of the riveting protrusions, and the riveting holes are symmetrically distributed at two sides of any one of diagonal lines of the first frame body.

5. The compound metal lid according to claim 1, wherein a quantity of the riveting holes is equal to a quantity of the riveting protrusions, and the riveting holes are symmetrically distributed at two sides of a central normal line of any side edge of the first frame body.

6. The compound metal lid according to claim 1, wherein the second frame body has four side frames that have identical width, and the riveting protrusions on each of the side frames of the second frame body are distributed along at least two straight lines.

7. The compound metal lid according to claim 1, wherein the first frame body has four inner edges, each of the inner edges has at least one extension part that protrudes toward a center of the first frame body, and an inner edge of the extension part is aligned to an inner edge of the second frame body.

8. The compound metal lid according to claim 1, wherein the first frame body has four inner corners, and each of the inner corners has a square notch.

9. The compound metal lid according to claim 1, wherein an outer edge of the first cover is aligned to an outer edge of the second cover.

* * * * *